United States Patent [19]
Dube

[11] Patent Number: 4,655,542
[45] Date of Patent: Apr. 7, 1987

[54] OPTICAL SIGNAL PROCESSING ARRANGEMENTS

[75] Inventor: Roger R. Dube, Tucson, Ariz.

[73] Assignee: International Business Machines Corporation, Armonk, N.Y.

[21] Appl. No.: 731,192

[22] Filed: May 6, 1985

[51] Int. Cl.[4] .......................... G03H 1/02; G03H 1/16
[52] U.S. Cl. .................................. 350/3.64; 350/3.6; 350/3.82
[58] Field of Search .................. 350/3.6, 3.64, 3.82

[56] References Cited
U.S. PATENT DOCUMENTS
3,651,485  3/1972  McDonnell ....................... 350/3.78
3,912,391  10/1975  Fleisher ............................. 350/3.75

*Primary Examiner*—Bruce Y. Arnold
*Attorney, Agent, or Firm*—H. F. Somermeyer

[57] ABSTRACT

Shade or tint intensities in holograms are calibrated by an array of calibration pixels in each hologram. The preferred array consists of crossed lines of the calibration pixels in the hologram disposed to cover all critical portions of the hologram. An optical processing apparatus employing a hologram having an array of calibration pixels is disclosed.

14 Claims, 7 Drawing Figures

APPARENT
DETECTOR
ORIENTATIONS

OPTICAL SIGNAL PROCESSING ARRANGEMENTS

DOCUMENTS INCORPORATED BY REFERENCE

U.S. Pat. No. 3,651,485 is incorporated for its showing of circuits useful for a holographic data processing system with which the present invention may be advantageously practiced.

U.S. Pat. No. 3,912,391 is incorporated for its showing of circuits and optics useful for a holographic information storage and retrieval system with which the present invention may be advantageously practiced.

BACKGROUND OF THE INVENTION

1. Field of the Invention

The present invention relates to holographic optical processing apparatus and methods, and particularly to those apparatus and methods which overlay holograms in a common optical storage medium.

2. Discussion of the Prior Art

The so-called volume storage of holograms in electro-optic materials, such as bismuth silicon oxide, results in the overlaying of one hologram by another hologram. Such overlaying can occur by changing the angle of incidence of incoming interfering light beams, wave lengths of operation or physical location of the beams. Such overlaying tends to reduce the average intensity of all of the holograms in the overlaid area. Additionally, light-interfering contaminants (dust, etc.) or variations in the storage elements can change the intensity of the holograms. As a result, reproduction of a stored hologram results in variations in the intensity of the reproduced pixels (picture elements) of the hologram. Accordingly, it is desired to control the operation of the apparatus such that, even with variations in intensities caused by overlaying and other factors which can cause perturbations in holographic intensities, the intensities will be normalized, such as to an average intensity value of the hologram.

Holograms are generally processed using arrays of photoelements, either to emit light beams which interfere with other emitted light beams to create a hologram, or to intercept the hologram for reconstructing the image stored in the hologram. Some rectangular arrays (such as in video applications) of photoelements have included a small number of photoelements used to indicate "washout" of an image being processed. Identification of such washouts of images does not accommodate variations in individual pixel intensity levels in an array of pixels being processed. Such accommodation becomes important when data is stored in the hologram as one level of light intensity out of a plurality of possible light intensity levels; for example 16 levels of light intensity. Such light intensity levels are considered as light states. Accordingly, it is desired to provide a normalization of the intensity of a hologram for ensuring a more faithful reproduction of stored images.

SUMMARY OF THE INVENTION

It is an object of the present invention to normalize light intensity of volume-stored holograms by normalizing light states in various optical processing apparatus.

In optical storage media for storing holograms or other arrays of pixels, dispersing intensity-calibration pixels amongst the information-bearing pixels provides a reference intensity calibration. The calibration pixels contain light states having a priori light intensities. In a preferred form, the calibration pixels are arranged in predetermined rows and columns within the array such that an average of the light intensities for the entire array is established. Such established light-reference intensity calibrates the entire holographic image for precisely identifying which light state is in each pixel for enabling a faithful reproduction of the stored digital information.

Optical processing apparatus useful for practicing the present invention includes an image processing unit for processing a rectangular array of pixels using a corresponding rectangular array of photoelements. Each pixel is associable with one of the photoelements. Further, each pixel can take any one of a first plurality of light states for representing information in an array of photoelements arranged in rows and columns. So-called footprint means in the processing unit operatively connect to the photoelements for identifying the predetermined ones of the rows and columns and other calibration-designated photoelements. The designated photoelements, or the predetermined rows and columns, are spaced apart and dispersed within the rectangular array for establishing an averaging value for a reference light-state value. Scanning means connected to the processing unit and to the footprint means scan the rows and columns of the rectangular array of photoelements and exchange electrical signals therewith for first determining the normalized intensity value and then for transferring electrical signals related to information-bearing pixels.

In a data storage apparatus, a pair of image processing units is employed. One of the units emits arrays of pixels which include the calibrating pixels. An intervening storage member, or other processing form such as optical fibers or electro-optic materials, stores or transports the emitted pixel arrays. A second image processing unit receives the pixel arrays from the intervening storage array or optical fibers, and the like. Calibration means operatively associated with the receiving array of photoelements adjusts signal detection circuits in accordance with the received light intensities from the predetermined rows and columns, or of other designated photoelements, to accurately reproduce the information represented by the information-bearing pixels.

The foregoing and other objects, features, and advantages of the invention will be apparent from the following more particular description of the preferred embodiments of the invention, as illustrated in the accompanying drawings.

BRIEF DESCRIPTION OF THE DRAWINGS

FIG. diagrammatically illustrates apparatus incorporating the present invention.

DESCRIPTION OF THE PREFERRED EMBODIMENT

Figure 1:
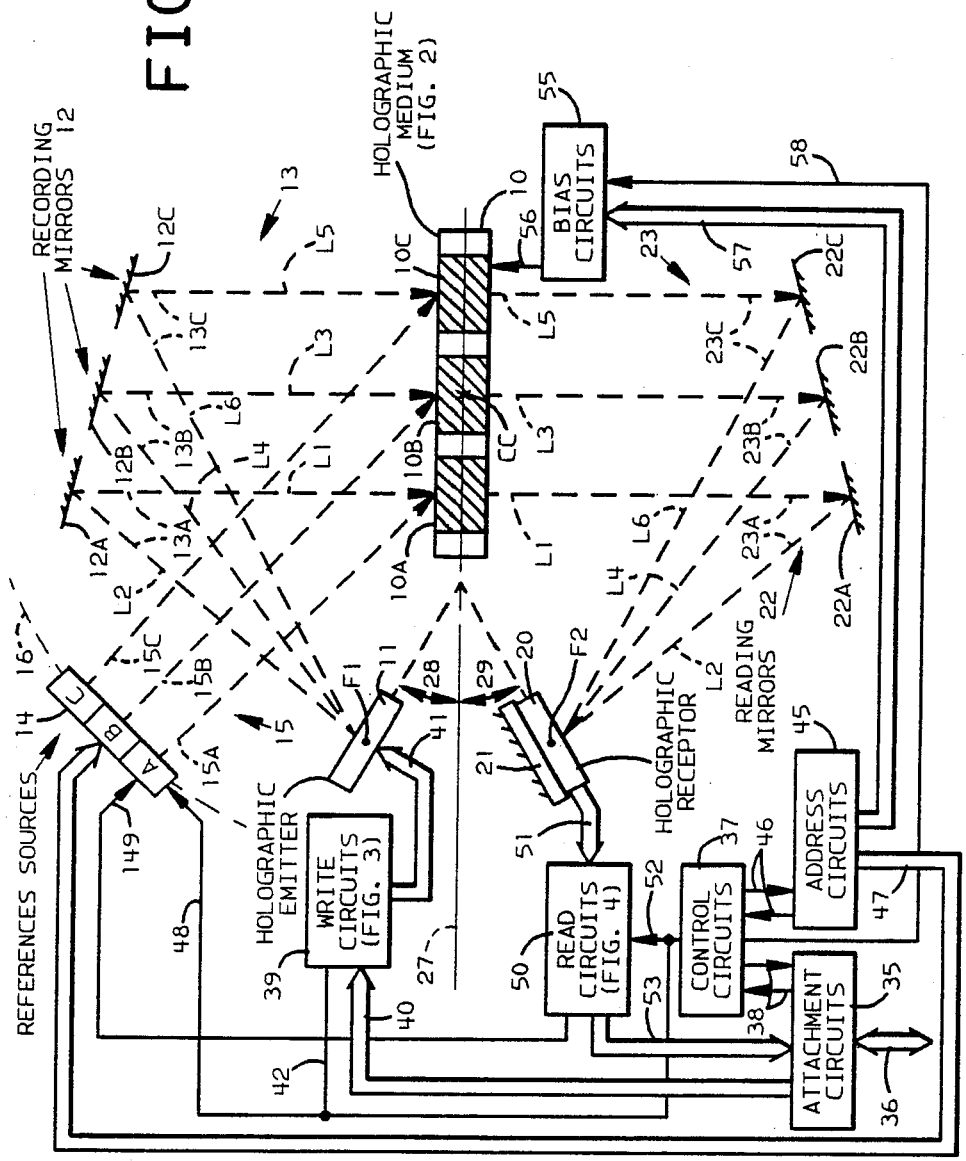

Referring now more particularly to the drawings, like numerals indicate like parts and structural features in the various figures. A holographic storage medium 10, such as a flat plate employing crystalline bismuth silicon oxide as a holographic storage element, receives light arrays for storage as holograms from holographic emitter 11 via a plurality of planar first-surface recording mirrors 12 disposed to form a parabola having its focal point F1 at holographic emitter 11. The arrangement is such that mirror 12A reflects light from emitter 11 to area 10A of holographic medium 10, while mirrors 12B and 12C, respectively, reflect the emitter 11 light to areas 10B and 10C of holographic medium 10. Holographic emitter 11 supplies its emitted light to all of the recording mirrors 12, either by electronic or electromechanical means. The arrangement is such that the effective lengths of the various light paths between holographic emitter 11 and the holographic medium 10 are identical. For example, light path 13A extending between holographic emitter 11 and area 10A includes a length L1 between holographic medium 10 and mirror 12A and a second portion having length L2 between mirror 12A and holographic emitter 11. Similarly, path 13B has lengths L3 and L4, while path 13C has lengths L5 and L6. To record a hologram of the volume type in holographic medium 10, the medium is activated electrically, as later described, and one, and only one, of the holographic storage sections 10A, 10B, or 10C and receives hologram-creating light from reference light source 14 via any one of a plurality of light beams 15. Portion A of reference light source 14 emits light beam 15A to holographic storage section 10A for recording the hologram-creating interference pattern produced by the light from holographic emitter 11 and portion A of reference light source 14. The angle of incidence of light beam 15A to section 10A of holographic medium 10 determines the location within medium 10 at which the created hologram resides. In a similar manner, portions B and C of reference light source 14 emit reference light beams 15B and 15C, respectively, for recording interference patterns with the holographic emitter 11 emitted light in sections 10B and 10C of holographic medium 10. For creating a family of holograms within holographic medium 10 in any of the sections 10A–10C, reference light source 14 is moved along a circular or hemispheric path 16 having a center of curvature CC about the geometric center of holographic medium 10. Changing the angle of incidence of the reference light beams 15 creates a different hologram within holographic medium 10. When holographic medium 10 has a linear array of sections 10A–C along a single line, then path 16 is implemented by an arcuate track. When a rectangular array M by N (where M and N are integers) of holographic sections is employed, then path 16 is implemented by a hemispheric transport. Such an arrangement can be provided by ball and socket connections wherein the reference light source 14 is mounted on the hemispheric surface of the ball immediately adjacent to the concave hemispheric surface of the socket. The ball in such an arrangement is preferably a hemispheric cup opening toward holographic medium 10 with reference light source 14 suitably mounted in the bottom of the cup.

Rather than having a movable reference light source 14, a plurality of addressable solid-state lasers can be disposed along line 16. Yet other reference light sources can readily be envisioned. For example, a plurality of first-surface mirrors can be disposed along line 16. A single laser may have its emitted light addressably deflected to a one of such mirrors for selecting a one of the storage segments, and reflect light to the selected segment at a predetermined angle.

The above description relates to the recording portion of the FIG. 1 illustrated system. Next the read-back portion is described, wherein a light beam from reference light source 14 is directed to one of the sections 10A–C of holographic medium 10 with the holographic emitter 11 being quiesced. One of the reference beams 15 shining on a one of sections 10A–C results in a hologram being transmitted from holographic medium 10 along one of the light paths 23 extending from holographic medium 10 to holographic receptor array 20 via one of the mirrors in the parabolic reading mirror array 22. Receptor array 20 is located at the focal point F2 of the parabola defined by the mirrors 22A, 22B, and 22C. Holographic receptor array 20 is secured to a three-dimensionally movable carriage assembly 21 for providing alignment and focusing motions, as later described. The receptor 20 consists of a rectangular array of photoreceptor cells, one cell per pixel of the holograms. Light path 23A extends from section 10A to holographic receptor 20 via mirror 22A, while light paths 23B and 23C, respectively, extend from sections 10B and 10C to holographic receptor 20 via mirrors 22B and 22C. The lengths of paths 23A, 23B, and 23C are identical and equal to the path lengths of paths 13A–C as respectively indicated by the lengths L1–L6.

The above-described arrangement shows an array of holographic storage sections 10A–C within a planar holographic medium 10 addressable by reference light source 14 and later-described electrical field energization circuits for enabling a single holographic emitter 11 to record a hologram in any one of the sections 10A–C. Similarly, a single holographic receptor 20 can receive a hologram from any of the sections 10A–C. When the FIG. 1 illustrated apparatus is used as an information or data processor, then the various stored holograms can mix the light beams from the holographic emitter 11 with the stored holograms for performing array processing functions detectable via receptor 20. The holographic emitter 11 is quiesced whenever the FIG. 1 illustrated apparatus is retrieving information-bearing signals from storage medium 10.

Figure 5:
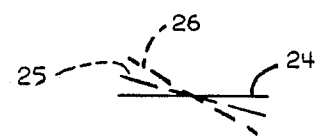
FIG. 5 illustrates some of the relative detector to emitter orientation effects associated with the FIG. 1 illustrated system.

Examination of the FIG. 1 illustrated apparatus shows various angles of incidence of light to and from holographic image array 10. It is well known that, depending upon the angle of incidence, the size of the projected arrays will vary. For example, as illustrated in FIG. 5, numeral 24 indicates the ideal apparent detector orientation. Depending upon the angle of incidence, the size of the projected array is reduced in size as indicated by dashed and dotted lines 25, 26 which can result in error conditions or, at best, decreased signal-to-noise ratio in the holographic processor. Accordingly, it is desired to have a consistent projection in the holographic receptor 20 which always corresponds to the holographic emitter 11 emitted light beams. The FIG. 1 illustrated apparatus achieves this function by aligning holographic medium 10 along a center reference plane 27, arranging the mirrors 12 and 22 symmetrically to plane 27, keeping all of the light paths 13 and 23 of identical lengths and symmetrically disposing the holographic emitter 11 and the holographic receptor 20 with respect to plane 27. This symmetry includes equal angles 28 and 29 subtended between the emitter array of photoelements of emitter 11 and the receptor photoelements of receptor 20. Such an arrangement also requires that the parabola as defined by the mirrors 12 and 22 be identical and have identical spatial relationships to the storage sections 10A–C. It is also preferred that the portions of the paths 13 and 23 subtending lengths L1, L3, and L5 be substantially orthogonal to the reference plane 27. This arrangement assures that the holograms transmitted from holographic medium 10 by the reference beam 15 onto the reading mirror 22 always follow the illustrated paths.

Recording signals onto holographic medium 10 and reading back the recorded signals are next described. Attachment circuits 35 connect the FIG. 1 illustrated information-bearing-signal storage system to one or more host processors or other data-source links via a set of optical fibers or cables represented by double-headed arrow 36. Attachment circuits 35 can be those attachment circuits found in present-day peripheral data storage apparatus. Control circuits 37 operate the illustrated data storage system and are constructed similarly to present-day peripheral data storage controllers. Control circuits 37 are coupled to attachment circuits 35 via command and status signal paths 38 for receiving requests and instructions from a connected host processor (not shown) and for supplying status information to that host processor. It is to be appreciated that each of the holograms stored in the holographic medium 10 is separately addressable.

For recording information-bearing signals onto holographic medium 10, instructions received from the connected host processor, as interpreted by control circuits 37, prime the illustrated system for receiving data. The data is received through attachment circuits 35 and transferred to a set of write circuits 39 (detailed in FIG. 3) via a cable or optical fiber 40. Write circuits 39 accumulate the received data for creating an "image form" of the data suitable for storage as holograms. The term "image form" means the input data is arranged into a rectangular array of groups of bits; each pixel in the hologram corresponding to the binary value of each group. For example, a sixteen-intensity-level pixel represents four bits in one group--the input data array then being arranged as a M×N (M and N are integers) array of four bit groups. The input data array of encoded and reformatted data is transferred over data paths, which may be a cable or optical fiber, to the holographic emitter 11. Write circuits 39 are suitably controlled by control circuits 37, as indicated by control line 42.

The addressing of the holographic storage sections 10A–C in holographic medium 10 is handled through address circuits 45, which are coupled to control circuits 37 via a set of signal transferring lines 46. The addresses are received from the connected host processor through attachment circuits 35 and are interpreted and adapted for the following described addressing by circuits 45. Two levels of addressing are provided. A first level is through the positioning and actuation of reference light source 14 as controlled by address circuits 45 via address path 47. The operation of reference light source 14 is timed in an usual manner by timing control signals supplied over line 48 to the reference light source 14 by control circuits 37. The supplied addresses to reference light source 14 select one of the three sections 10A, 10B, or 10C to emit its corresponding light beam 15 for selecting one of the three sections 10A, 10B, or 10C. Further, the positioning of reference light source 14 along hemispheric support 16 provides further addressing by changing the angle of incidence of the referenced light beams 15 to the surface of holographic medium 10.

When the holographic medium 10 is of a crystalline type which is activated by electrical fields provided in the medium, such as may be used for bismuth silicon oxide, a second level of addressing to select a section 10A–C for recording is provided by bias circuits 55, as later detailed. Connection 56 represents the later-described electrode connections for selecting that portion of the holographic medium 10 to receive a hologram for recording. Address path 57 connects address circuits 45 to bias circuits 55 for making the appropriate electric field selection. The timing is provided by control circuits 37 supplying timing signals over line 58 to bias circuits 55.

Figure 4:
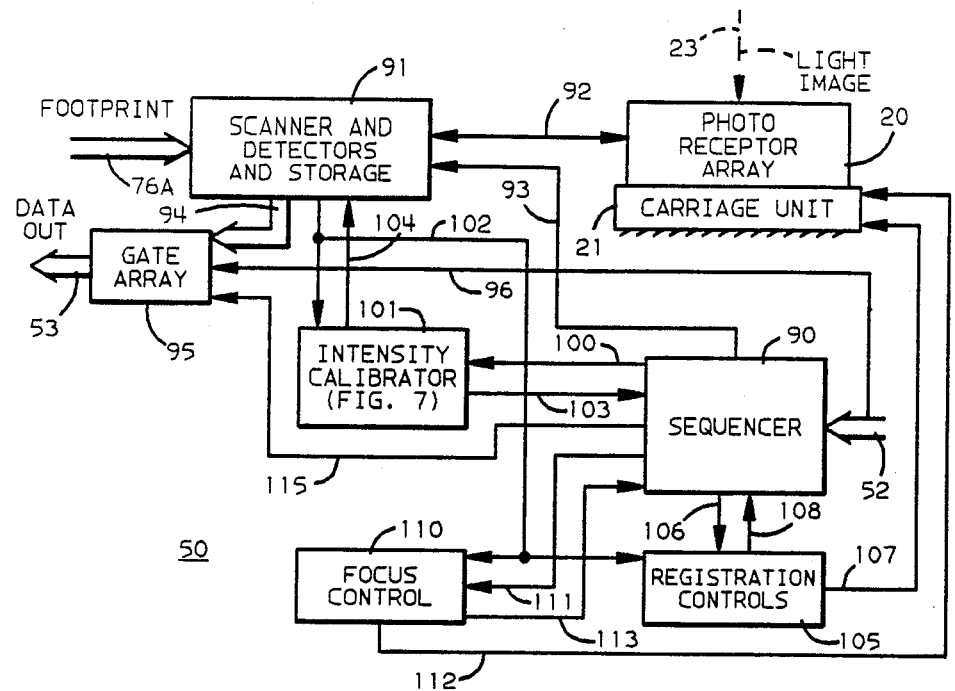
FIG. 4 is a block diagram of the read-back circuits used in the FIG. 1 illustrated system.

The read-back of stored holograms from holographic medium 10 is controlled by read circuits 50 as detailed in FIG. 4. Data path 51 transfers the received and detected hologram signals sent by receptor 20 to read circuits 50 for decoding and reformatting, as detailed in FIG. 4. Control path 52 transfers timing and other control signals from control circuits 37 to read circuits 50 for timing and managing read-back operations. Output data path 53 transfers the decoded and reformatted signals (reformatted from the "image form" array to serial by word or byte, i.e., data transfer of one byte in word at a time) from read circuits 50 through attachment circuits 35 to the host processor using present-day data transfer techniques.

Figure 2:
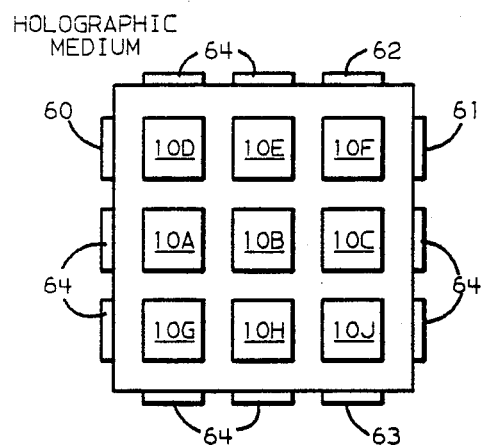
FIG. 2 is a diagrammatic plan view of a holographic medium used in the FIG. 1 illustrated system.

FIG. 2 illustrates, in simplified form, a two-dimensional planar array of hologram-storing sections 10A–J in a holographic medium 10. In such a medium consisting of bismuth silicon oxide, a plurality of electrodes 60–64 are disposed on and electrically attached to the body of holographic medium 10 for selectively inducing electric fields within the medium for enabling recording of holograms. For example, when an electric field is provided between electrodes 60 and 61, then any of the sections 10D, 10E, or 10F, or all three, can receive a hologram. The reference light beam 15 shining on one of the three sections 10D–F selects which of the three will in fact receive information-bearing signals for storage as a hologram. In a similar manner, an electric field induced between electrodes 62 and 63 enables sections 10F, 10C and 10J to receive data for storage as holograms. Electric fields also can be induced between electrodes 63 and 60, as well as between other pairs or electrodes. The significance of inducing different electric field combinations results in different electric fields within the medium. Such different electric fields enable the storage of data as holograms in different areas throughout the medium.

Overlaying a plurality of holograms in any one of the hologram storage sections tends to reduce the signal-to-noise ratio and the relative intensity of the stored hologram. Such reduction in intensity can induce errors in the read-back of data from those holograms. Accordingly, as later described, an automatic intensity gain-control apparatus is included in the FIG. 1 illustrated data storage system for accommodating such variable intensities.

Figure 3:
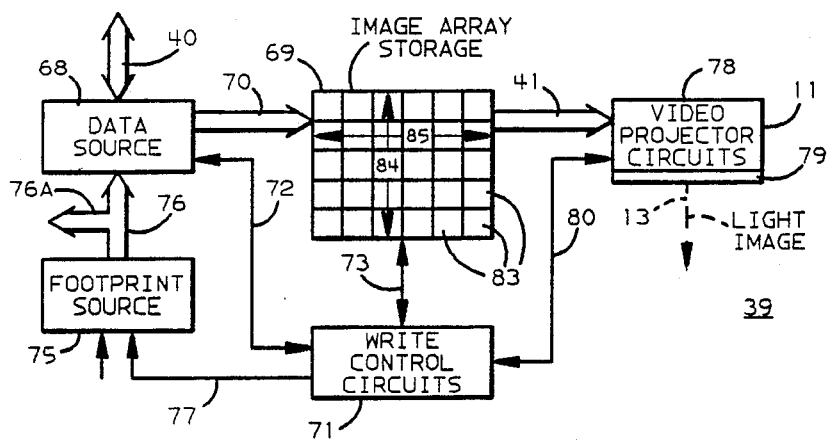
FIG. 3 is a block diagram illustrating write or recording circuits used in the FIG. 1 illustrated system.

Such regeneration and recording of holograms is better understood by referring next to FIG. 3. The data to be recorded is received by write circuits 39 over input data path 40. Data source 68 receives the data, adds suitable error detection and correction redundancies, as is well known, and arranges the received data into pixel groups of bits for storage in image array storage 69 via data path 70. The sequencing of operation of write circuits 39 is managed by write control circuits 71 which time the transfer of signals from data path 40 to the emitted light image 13. Control path 72 carries the suitable control and timing signals from circuit 71 to data source 68 and returns suitable status information, as is usually practiced in write circuits for various types of data recorders. In a similar manner, control and status path 73 extends from write control circuits 71 to image array storage 69. Image array storage 69 is divided into the pixel storage areas 83. The received data is transferred from data source 68 into image array storage 69 beginning in the upper left-hand corner and proceeding horizontally to complete a first row, then from left to right on succeeding rows until the array is filled. Each pixel data storage area stores a small number of bits which are translated into the hologram as one of a plurality of intensity levels. For example, if four bits are stored in each pixel area, then one of 16 intensity levels can be provided in the hologram. For eight bits being stored in each pixel area, any one of 256 possible intensity levels are stored. The number of data bits for each pixel area is empirically determined in accordance with design parameters for error detection and correction, sensitivity of detection of such intensity levels and what error rates can be accommodated.

As mentioned earlier, the intensity of a stored hologram can vary after storage by overlaying other holograms in the same hologram-storing section. To accommodate such subsequent variations, a footprint source 75, which can consist of a read-only memory (ROM), supplies footprint information over data path 76 to data source 68 and over cable 76A to read-back circuits for detection of the hologram. Footprints can be deleted from the detected holograms.

The finally assembled data bits and later-described footprints are transferred to holographic emitter 11 via data path 41. Emitter 11 consists of conventional video projector circuits 78, which convert the image-array-stored data from storage array 69 into video images which are projected by the projector 79 as a light image over path 13. The combination of image array storage 69 and the emitter 11 is similar to a video display terminal in that the image array storage 69 is equivalent to the refresh storage, and the video projector circuits 78 are equivalent to the display control circuits. A difference is that the refreshing of the projected light image over path 13 is limited to the time required to store the hologram in holographic medium 10, and that phase-coherent (laser) light is transmitted to record medium 10. Video projector circuits 78 are controlled by write control circuits 71 as indicated by the control connection 80. Such control follows usual control for video display and projection.

The emitter array 79 is preferably constructed using either an acousticopter modulator device (ADD) array or an array of transmissive liquid crystal devices (LCD). These devices are available on the market, and their construction and usage are known. For example, two-dimensional ADD arrays can be obtained from ISOMET, Springfield, Va. A (Model LS50-XX), while transmissive LCD arrays can be obtained from Epson America, Inc., Torrance, Calif. (Model ET-10).

Write control circuits 71 also provide control signals to footprint source 75 via path 77. For example, more than one footprint may be provided for identifying the class of data stored in the given hologram. For separating a footprint from a stored data image, the address of the hologram and the footprint characteristics are stored in a table (not shown) of the connected host processor (not shown) as reported to the host processor by control circuits 37. Alternately, the host processor can specify which footprint will go with each hologram and indicate to the holographic storage system which footprint is to be used. In the preferred embodiment, a footprint consists of a set of crossed lines in the projected light image having a predetermined intensity which can be used to calibrate the intensity of a read-back hologram. As seen in FIG. 3, the footprint consists of two crossed lines 84 and 85. Line 84 fills a column while line 85 fills a row with light intensity representing signals which are predetermined such that a reference intensity signal can be used for calibrating the hologram intensity. For example, if four bits are stored in each pixel area, then a value of nine can be used as a footprint. Value 9 is selected because it is an intermediate intensity. Any predetermined pattern may be employed for calibration; empirical testing may be required to obtain optimal results.

FIG. 4 illustrates the read-back and data reformatting of stored holograms. The timing and sequence of the read circuits 50 are controlled by sequencer 90, which is constructed using known read-back sequencing circuits. The design of each sequencer 90 is dependent upon a selected data format, the speed of the processing circuits and the size of the data units being processed, i.e., the number of bits of data stored in each hologram, for example. Sequencer 90 is controlled by control circuits 37 via control path 52. A key portion of read circuits 50 includes the scanner, detector and storage unit 91, which is connected to the photoreceptor array 20 by data path 92. Photoreceptor array 20 receives the light image over path 23. The array 20 consists of a rectangular array of photodetector elements, one for each pixel in the stored hologram, which are addressable by rows and columns. The output of the array is a composite intensity-indicating signal for a row and a composite intensity-indicating signal for a column. Known video processing circuits within the scanner and detector unit 91 convert the analog intensity representations of each pixel to the bits stored in each pixel group. For example, when four bits are stored in a pixel group, an analog-to-digital corrector (not shown) within unit 91 quantizes the received video intensity to one of 16 possible intensity levels. Such quantization is then converted into four bits which is a faithful reproduction of the originally stored data. Error detection and correction redundancies accommodate misdetection of the intensity levels, as is done for all forms of recording. Unit 91 includes an image array storage (not shown) similar to image array storage 69 of FIG. 3 for facilitating error detection and correction. That is, the detected pixel values are stored into respective pixel storage areas 83. The pixel data is then analyzed using known error detection and correction techniques before being sent over path 94 to gate array 95, which commutates the stored array data into a series of data bytes to be transferred over multibit path 53 to attachment circuits 35. Sequencer 90, during data read-back, supplies control signals over control paths 93 to scanner, detector and storage unit 91. The gates (not shown) in gate array 95 are enabled by control signals on line 96 received from control circuits 37 via control path 52. Sequencer 90 supplies an enabling signal over control path 115 for passing the detected data after the following-described detection circuit calibration.

Calibration of read circuits 50 relates to three holographic parameters. A first parameter, intensity calibration, was discussed previously and in the preferred embodiment is the first parameter to be calibrated. The second parameter is the registration with the photoreceptor array 20 of the incoming holographic light image on a path 23. A third parameter is the focus of the image. The latter two parameters are calibrated via actuation of carriage unit 21.

Sequencer 90, in response to a control signal received from control circuits 37 over path 52, supplies a control signal over path 100 to intensity calibrator 101. Calibrator 101 is detailed in FIG. 7. Calibrator 101 receives the detected signals of the light image from unit 91 over path 102 and supplies control signals to unit 91 over path 104. As soon as calibrator 101 has calibrated the intensity of the hologram being received, it supplies a complete signal over path 103 to sequencer 90. Registration of the pixels with the photoreceptors or photocells in array 20 is initiated by sequencer 90 supplying an initiation signal over signal path 106 to registration controls 105. Registration controls 105 receive the scanned input signals from unit 91 over path 102 for measuring the registration. The footprints 84-85 are used for implementing registration of the incoming light beams to the photoreceptor array 20. Registration controls 105 supply carriage positioning signals over path 107 to carriage unit 21 for moving photoreceptor array 20 in an xy dimension perpendicularly to the axis (not shown) of incoming light beam 23. Registration of incoming light beams with photoreceptor arrays is well known in the art and is not described for that reason. Upon verifying registration of the pixels with the photoreceptor array 20 photocells, registration controls 105 supply a completion signal over path 108 to sequencer 90.

In response to the registration completion signal, sequencer 90 initiates focusing the incoming light to the photoreceptor array by activating focus controls 110 via an initiation signal over path 111. Focus controls 110 respond to the signals supplied over line 102 from unit 91 to generate a focus error signal. Focus error signal travels over path 112 to carriage unit 21 for moving photoreceptor array 20 along the axis (not shown) of the incoming light beam 23 for focusing the light, as is well known. Various forms of focus detectors can be used within the photoreceptor arrays; for example, a knife-edge detector can be employed and incorporated into photoreceptor array 20. With this error signal being supplied to unit 91 over path 92, unit 91 in turn relays the focus error signal over line 102 to focus controls 110. Controls 110 then generate a servo control signal for a focusing movement of carriage unit 21. Since such focus controls are well known, they are not detailed here. Upon obtaining appropriate focus, controls 110 supply a focus completion signal over signal path 113 to sequeneer 90 signifying the completion of the calibration procedures. Sequencer 90 then responds by supplying an activating signal over path 115 to gate array 95 and an initiate data read signal over line 93 to unit 91. The combination of the focusing and registration steps can be sequenced for facilitating scaling of a hologram.

Figure 6:
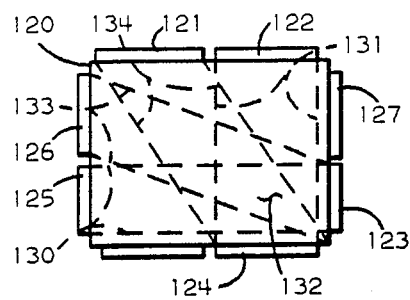
FIG. 6 is a diagrammatic illustration of electric field selection of holographic areas for a holographic medium used in the FIG. 1 illustrated system.

FIG. 6 diagrammatically illustrates the biasing effects of electrodes on a holographic storage medium 120. Electrodes 121 through 127 provide for generation of electric fields in the medium for the reception of storage of holograms created by light interference patterns from a reference means and an information-bearing beam. Dashed lines 130 represent a first electric field between electrodes 123 and 125 for receiving light to create a hologram. Dashed lines 131 represent a similar field extending between electrodes 122 and 124, at a different time, of course, for creating holograms between those two electrodes. Area 132, which is the intersection of the lines 131 and 130, can store holograms based upon the electric field from either pair of electrodes 122, 124 or 123, 125. Two holograms stored in area 132 will not interfere with each other, but will reduce the relative intensities of the stored holograms, requiring the above-described intensity calibration. Third and fourth holographic zones are represented by numerals 133 and 134. Various combinations and overlapping of these hologram storage areas result in variations in the intensities but do permit "stacking" of holograms in the storage medium 120 volume.

Figure 7:
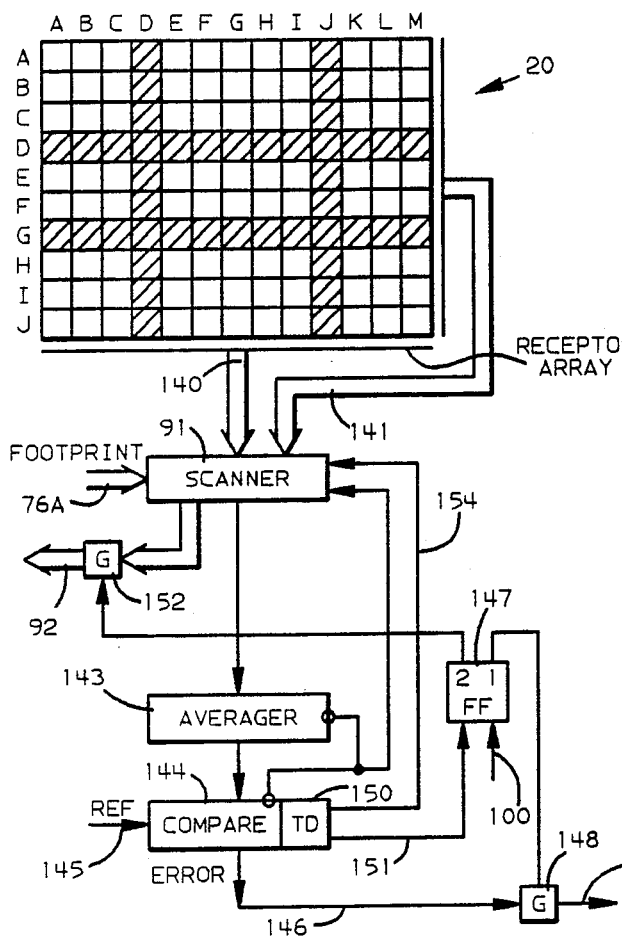
FIG. 7 illustrates, in block diagram form, intensity calibration circuits usable with the FIG. 4 illustrated circuits.

FIG. 7 illustrates the intensity calibration circuits of calibrator 101. Receptor 20 is shown in diagrammatic form with each unnumbered square representing a photoreceptor. The alphabetic characters A–M along the top of the array represent the column designations, while the left-hand alphabetic characters A–J represent the row designations. The shaded squares represent the footprint of the incoming image. The columns A–M are scanned serially from left to right as represented by the numeral 140, while the rows A–J are scanned from top to bottom as represented by the numeral 141 Scanner unit 91 provides the scanning of the rows and columns, as is well known. The scanner of unit 91 is personalized by the footprint signal received over path 76A from footprint source 75 (FIG. 3). Such personalization consists of gating circuits which respond to the footprint signal to divert the signals representing the footprint from the data stream to the calibration circuits. Such diversion of signals, using gating means and column and row addresses, is well known. The scanner 91 serially supplies the scanned signals to averager 143. Averager 143 can be an analog integration circuit. It is to be understood that the read-back signals from the receptor 20 can be digitized with the averager 143 being of the digital type. Averager 143 supplies its averaged signals at the end of a scan of both columns and rows of the footprints as represented by the shaded lines To compare circuit 144, the scan timing controls and scan completion signal are not shown for brevity. Compare circuit 144 compares the received averaged calibration light intensity representing signal with a reference signal (which can be in numerical value) supplied over line 145 as from a voltage divider circuit and the like. For a digitalized implementation, reference line 145 is replaced by a digital register storing a number indicative of the normalized pixel intensity value. Compare 144 generates an error signal supplied over line 146 which is used as later described to adjust the magnitude of the signals being supplied to match the reference signal on line 145.

Calibration and scanning are initiated by sequencer 90 (FIG. 4) supplying its initiation signal over line 100 for setting flip-flop FF 147 to a first or calibrate state for activating scanner 91, enabling averager 143 and compare circuit 144 to perform the to-be-described calibration function. When flip-flop FF 147 is in the first state, analog gate 148 passes the error signal on line 146 to line 149 connected to the reference light source 14 laser. The output intensity of the laser, such as a solid-state laser, is changed for changing the intensity of the reference beam 15 and, hence, the readout intensity of the hologram. This calibration loop continues until threshold detectors TD 150 determine that the difference between the averager 143 output signal value and the reference signal value at line 145 is sufficiently small that further changes to the referenced laser are unnecessary. Then threshold detector TD 150 supplies an END signal over line 151 setting flip-flop FF 147 to a second, or operate, state. This action disables analog gate 148 and enables gates 152 for supplying the scanned signals on to path 92 as read-back signals. Calibration is also obtained in a facile manner by inserting variable gain amplifiers in the paths 140, 141. The gain of such amplifiers are adjusted as described above by connecting line 149 to the gain control input of such amplifiers and holding the gain control constant upon termination of the calibration. The repetitive scans of the rows and columns of receptor array 20 are reinstituted by threshold detector TD 150 supplying a signal over line 154 for initiating scanner 91 to step through another cycle.

While the invention has been particularly shown and described with reference to preferred embodiments thereof, it will be understood by those skilled in the art that various changes in form and details may be made therein without departing from the spirit and scope of the invention.

What is claimed is:

1. Holographic apparatus comprising means for containing a rectangular array of pixels in rows and columns representing information in the frequency domain including a plurality of spaced-apart rows and columns of bits representing light-related parameters including light-intensity references whereby actual light intensities of pixels in the array can be calibrated.

2. The holographic apparatus set forth in claim 1, wherein said spaced-apart rows and columns are evenly distributed throughout said array and contain pixels representing the same light intensity in all portions of said spaced-apart rows and columns.

3. The holographic apparatus set forth in claim 1, wherein all of said spaced-apart rows and columns are interior to the array such that none of said spaced-apart rows and columns form an elongated border of the array.

4. An optical processing apparatus, including the combination of:
an image processing unit having a first rectangular array of photoelements to convert signals between light and electrical energy for processing a rectangular array of pixels constituting an image and wherein each pixel can take any one of a first plurality of light states for representing information said first array having an array of photoelements arranged in rows and columns corresponding to said rectangular array of pixels such that one photoelement corresponds to one pixel;
footprint means in the processing unit operatively connected to said array of photoelements for identifying predetermined ones of said rows and columns of photoelements, said predetermined rows and columns being spaced apart in the array of photoelements; and
scanning means connected to said processing unit and to said footprint means for scanning said rows and columns in said array of photoelements for transferring electrical signals therewith representative, of said pixels and including transferring identical intensity pixel-representing signals with all of said predetermined ones of said rows and columns in said array of photoelements.

5. The optical processing apparatus set forth in claim 4, further including the combination of:
a data storage unit connected to said footprint means and to said scanning means for transferring pixel-representing signals therewith and having a rectangular array of addressable pixel-signal storage areas, each of said pixel-signal storage areas being capable of storing a predetermined number of bits for representing said first plurality of light states, said array of pixel-signal storage areas being identical to said array of pixels; and
data transfer means connected to said data storage unit and to said scanning means for transferring data signals with the data storage unit such that the data,is logically related to said pixels and said identical intensity pixel-representing signals are transferred with said predetermined rows and columns.

6. The optical processing apparatus set forth in claim 5, further including the combination of:
calibration means connected to said footprint means and to said scanning means for transferring said identical pixel-representing signals therewith;
reference means for supplying a light-state reference signal;
comparison means in said calibration means connected to said reference means for receiving said reference signal and connected to said scanning means for receiving said pixel-representing signals to compare said reference signal with said received pixel-representing signals for supplying an output light-state error signal;
correction means connected to said comparison means for receiving said error signal and to said image processing unit for deriving a light-state correction signal and for supplying said light-state correction signal to said image processing unit; wherein
said image processing unit responds to said supplied light-state correction signal to adjust the light states of said identical pixels to match a light state represented by said light-state reference signal.

7. The optical processing apparatus set forth in claim 6, further including the combination of:
said rectangular array of photoelements receiving signals as light energy and converting same into electrical signals representative of the received light-energy signals;
focusing means connected to said rectangular array of photoelements and including adjustment means for moving the photoelements for obtaining focus and having circuit means receiving said converted electrical signals from said predetermined rows and columns to focus the photoelements to the incoming light energy; and
registration means having xy movement means connected to said rectangular array of photoelements for adjusting the position of the photoelements in the plane of the rectangular array, and having circuit means for driving the adjustment means and connected to said scanning means for receiving signals from said predetermined rows and columns for registering said rectangular array of photoelements to said predetermined rows and columns.

8. The optical processing apparatus as set forth in claim 7, further including the combination of:
image-processing circuit means connected to said scanning means for receiving signals therefrom generated by all of the said photoelements in said rectangular array except from the photoelements in said predetermined rows and columns for generating digital signals representing information carried by said received light-energy signals as pixels; wherein
said image-processing circuit means is connected to said correction means for receiving said light-state correction signal for adjusting the conversion of the received signals to that indicated by the pixels in said predetermined rows and columns.

9. The optical processing apparatus as set forth in claim 8, further including the combination of:
means in said comparison means and means in said image processing means responsive to said received signals representing diverse light intensities received by the respective photoelements for indicating digital information which is coded as light intensities such that said light state is one of a predetermined number of light intensities in each of said pixels.

10. The optical processing apparatus set forth in claim 4, further including, in combination:
said image processing unit including a second rectangular array of photoelements arranged in rows and columns and having the same number of photoelements as said first array and having predetermined ones of rows and columns, all of said photoelements in said second array emitting pixels of light corresponding to electrical signals applied thereto;
an optical signal storage unit disposed to receive pixels emitted by said second array of photoelements and to supply pixels to said first array of photoelements, and having activation means for retentively receiving pixels from said second array and for re-emitting pixels representative of said retentively-received pixels; wherein
said photoelements in said first array are for receiving and converting said re-emitted pixels into electrical signals; wherein
second array is connected to said footprint means and said scanning means for receiving said identical pixel-representng signals for supplying identical intensity pixel-representing signals from said predetermined rows and columns.

11. The optical processing apparatus set forth in claim 10, further including in combination:
said light storage element consisting of electro-optic material; and
said activation means, including a laser light means shining a light on said light storage element for activating same such that said emitted pixels combined with said activation-means-emitted activating light to form interference patterns within said light storage element in the frequency domain, and such that said activation-means-emitted light beam causes said re-emission of the retentively-received pixels.

12. The optical processing apparatus set forth in claim 11, further including a data and coding unit in said image processing unit for converting digital information-representing signals into one of a large plurality of signal levels for generating a corresponding one of a same plurality of light intensities in each pixel; and
data decoding means connected to said first rectangular array of photoelements and being responsive to signals generated by the photoelements in response to said reemitted pixels for regenerating said digital signals whereby a data storage unit is implemented by the optical processing apparatus.

13. The optical processing apparatus set forth in claim 11, further including adjustment means in said activation means for changing the angle of incidence and locations of said activation-means-emitted light beams for enabling storing a plurality of said generated holograms.

14. An optical processor comprising, in combination:
a rectangular array of optical elements arranged in rows and columns each of said optical elements being capable of converting information-bearing signals between optical and electrical form;
predetermined ones of said optical elements being spaced apart in the array and being distributed within the array in a predetermined arrangement to enable an indication of relative light intensities for all of the optical elements; and
calibration means connected to said predetermined ones of said optical elements for transferring calibration signals therewith and having compensation means connected to said optical elements other than said predetermined optical elements and being responsive to said calibration signals for changing the operation of such other optical elements such that the calibration signals normalize said operation of said other optical elements to said predetermined optical elements.

* * * * *